(12) United States Patent
Wu et al.

(10) Patent No.: US 10,734,612 B2
(45) Date of Patent: *Aug. 4, 2020

(54) DISPLAY DEVICE

(71) Applicant: InnoLux Corporation, Miao-Li County (TW)

(72) Inventors: Yuan-Lin Wu, Miao-Li County (TW); Kuan-Feng Lee, Miao-Li County (TW); Jui-Jen Yueh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,574

(22) Filed: Jun. 17, 2019

(65) Prior Publication Data

US 2019/0305256 A1 Oct. 3, 2019

Related U.S. Application Data

(63) Continuation of application No. 15/921,677, filed on Mar. 15, 2018, now Pat. No. 10,367,173.

(51) Int. Cl.
*H01L 51/52* (2006.01)
*H01L 27/32* (2006.01)
*H01L 51/00* (2006.01)
*H01L 51/50* (2006.01)
*H01L 25/065* (2006.01)
(Continued)

(52) U.S. Cl.
CPC .......... *H01L 51/5281* (2013.01); *G02B 1/14* (2015.01); *G02F 1/133* (2013.01); *H01L 23/5387* (2013.01); *H01L 25/0655* (2013.01); *H01L 27/1214* (2013.01); *H01L 27/323* (2013.01); *H01L 27/3244* (2013.01); *H01L 33/502* (2013.01); *H01L 33/58* (2013.01); *H01L 51/0097* (2013.01); *H01L 51/502* (2013.01); *H01L 51/5253* (2013.01); *G06F 3/041* (2013.01); *H01L 25/0753* (2013.01); *H01L 2251/5338* (2013.01); *H01L 2251/558* (2013.01); *H01L 2933/0083* (2013.01)

(58) Field of Classification Search
CPC ............ H01L 51/5281; H01L 27/1214; H01L 33/502; H01L 51/0097; H01L 23/5387; H01L 51/5253; H01L 27/3244; H01L 2251/5338; G02B 1/14
See application file for complete search history.

(56) References Cited

U.S. PATENT DOCUMENTS 10,367,173 B1 * 7/2019 Wu ..................... H01L 51/5281
2016/0066409 A1 3/2016 Kwon
(Continued)

*Primary Examiner* — Julia Slutsker
(74) *Attorney, Agent, or Firm* — Winston Hsu

(57) ABSTRACT

A display device is provided and includes a supporting substrate, a first flexible substrate, an oxide layer, a first insulating layer, a light emitting unit, and a protective layer. The first flexible substrate is disposed on the supporting substrate, and the oxide layer is disposed on the first flexible substrate. The first insulating layer is disposed on the oxide layer, and in a cross-sectional view, the first insulating layer has at least one opening. The light emitting unit is disposed on the first insulating layer, the protective layer is disposed on the light emitting unit, and at least a portion of the protective layer is disposed in the at least one opening.

20 Claims, 12 Drawing Sheets

(51) Int. Cl.
*H01L 27/12* (2006.01)
*H01L 23/538* (2006.01)
*H01L 33/50* (2010.01)
*H01L 33/58* (2010.01)
*G02B 1/14* (2015.01)
*G02F 1/133* (2006.01)
*G06F 3/041* (2006.01)
*H01L 25/075* (2006.01)

(56) References Cited

U.S. PATENT DOCUMENTS

2016/0252665 A1 9/2016 Lee
2016/0324018 A1 11/2016 Choi
2017/0010391 A1 1/2017 Lim
2017/0373281 A1 12/2017 Park
2018/0017714 A1 1/2018 Nomoto

* cited by examiner

DISPLAY DEVICE

CROSS REFERENCE TO RELATED APPLICATIONS

This application is a continuation application of U.S. patent application Ser. No. 15/921,677 filed Mar. 15, 2018, the contents of which are hereby incorporated by reference in their entirety.

BACKGROUND OF THE DISCLOSURE

1. Field of the Disclosure

The present disclosure relates to a display device, and more particularly to a foldable display device.

2. Description of the Prior Art

In recent years, foldable display design has become one of next generation technologies. A foldable display device means the device can be curved, folded, stretched, flexed, or the like (generally referred to as "foldable" hereinafter), so the foldable display device offers portability when in a folded state and expands into a relatively large sized display when in an unfolded state. Accordingly, the foldable display device may have various applications in electronic displays used in televisions, monitors, mobile computing devices, such as smartphones, tablet computers, mobile personal computers (PCs), and electronic book readers, and wearable devices, such as smart watches. However, the more the number of the stacked layers or films of the display device is, the more complicated the stresses among the display device when the display device is in the folded state or a bent state, which will limit the folding or bending angle of the display device, or damage the layers or films of the display device. Thus, it's still in need of facilitating folding or bending of the display device and mitigating damage to the elements in the display device.

SUMMARY OF THE DISCLOSURE

The present disclosure provides a display device that includes a display panel, a polarizer layer, and a cover layer. The polarizer layer is disposed on the display panel and has a first thickness. The cover layer is directly formed on the polarizer layer and has a second thickness. The cover layer has a pencil hardness greater than or equal to 6H, and the first thickness is greater than the second thickness.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

It should be noted that the technical features in different embodiments described in the following can be replaced, recombined, or mixed with one another to constitute another embodiment without departing from the spirit of the present disclosure.

Figure 1:
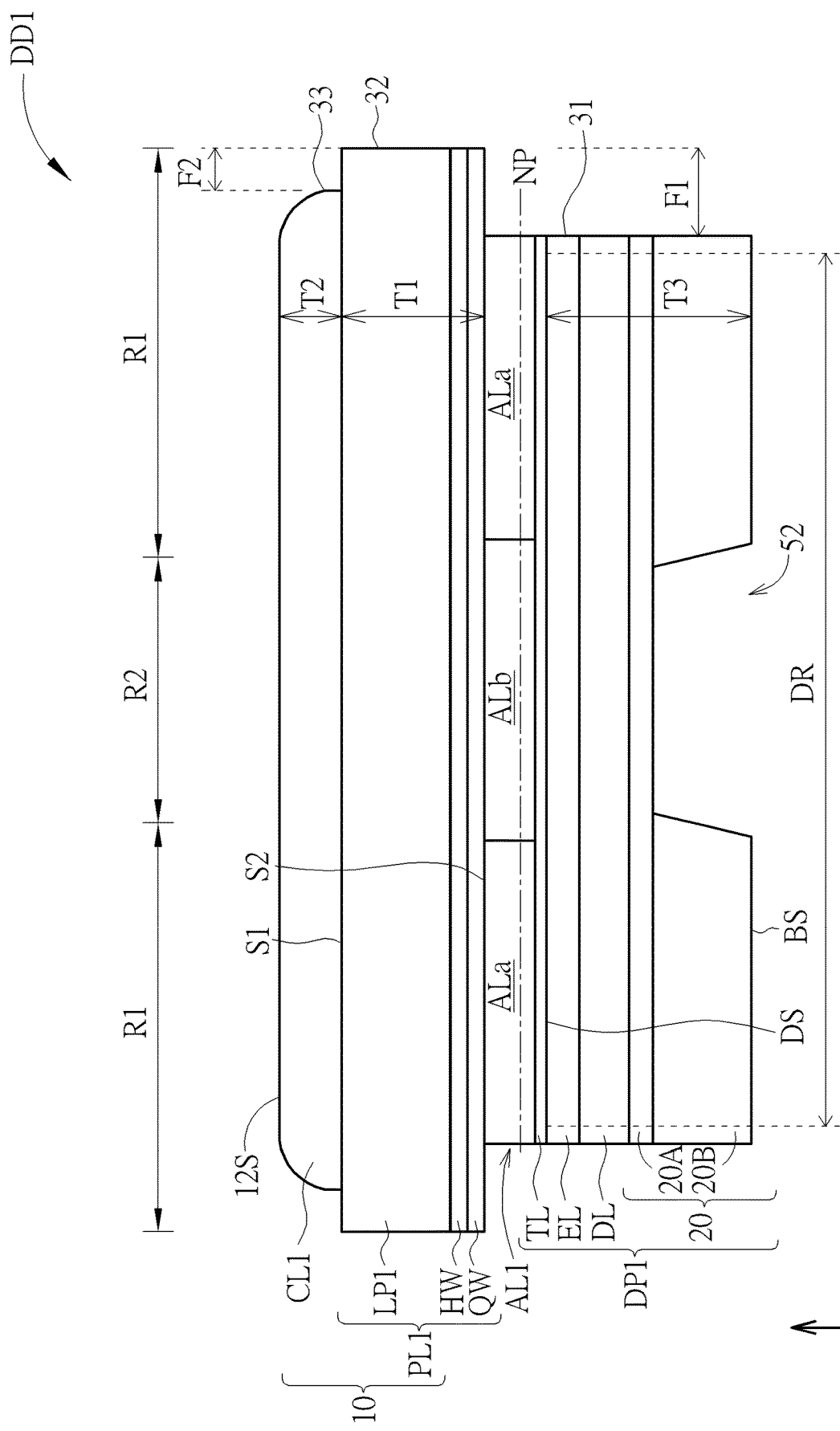
FIG. 1 schematically illustrates a cross-sectional view of a display device according to a first embodiment of the present disclosure.

FIG. 1 schematically illustrates a cross-sectional view of a display device according to a first embodiment of the present disclosure. The display device DD1 is a flexible or foldable display device and includes a display panel DP1, a polarizer layer PL1, and a cover layer CL1, in which the polarizer layer PL1 is disposed on the display panel DP1, and the cover layer CL1 is directly formed on the polarizer layer PL1. Specifically, the polarizer layer PL1 has a first surface S1 and a second surface S2 opposite to each other, the cover layer CL1 is directly formed on the first surface S1, and the second surface S2 of the polarizer layer PL1 faces the display panel DP1. Since the cover layer CL1 is directly formed on the polarizer layer PL1, extra layers, such as an adhesive layer for attaching the cover layer CL1 to the polarizer layer PL1, can be not present between the polarizer layer PL1 and the cover layer CL1. When a conventional display device is folded, stress will be generated. According to some embodiments, due to the absence of the extra layers between the polarizer layer PL1 and the cover layer CL1, the stress between the extra layers and the stresses between the cover layer CL1 and the extra layers and between the extra layers and the polarizer layer PL1 can be prevented, thereby simplifying the stress between the cover layer CL1 and the polarizer layer PL1 and mitigating the stress between them.

In the present disclosure, the cover layer is "directly formed on" the polarizer layer means that the cover layer is disposed on the polarizer layer not by any adhesive. That is, there is no adhesive present between the cover layer and the polarizer layer, and contact between the cover layer and the polarizer layer is not by adhesion. For example, the first surface S1 of the polarizer layer PL1 is fully exposed before forming the cover layer CL1, so when the cover layer CL1 is formed on the first surface S1, a surface of the cover layer CL1 facing the polarizer layer PL1 can be fully in contact with the first surface S1 of the polarizer layer PL1. It should be understood that some undesired defects, such as voids, may exist between the cover layer CL1 and the polarizer layer PL1, which may be generated during the manufacturing process of the cover layer CL1. This circumstance may still be interpreted as "the cover layer CL1 is directly formed on the polarizer layer PL1".

In addition, the cover layer CL1 directly formed on the polarizer layer PL1 serves as an outmost layer of the display device DD1 for protecting the elements in the display device DD1 from damage, breakage or scratch. In some embodiments, the cover layer CL1 can have a pencil hardness greater than or equal to 6H. To provide the display device DD1 with flexibility or foldability, the cover layer CL1 can have flexibility or foldability. In some embodiments, the cover layer CL1 can be a polymer. For example, the cover layer CL1 is formed of organic hybrid resin, inorganic hybrid resin, acryl resin, polyimide, polycarbonate, poly (methyl methacrylate), polyethersulfone, polyamide, polyamide imide, polycarbonate poly(methyl methacrylate) copolymer, acrylic or silicone resins or the like. The method for forming the cover layer CL1 on the polarizer layer PL1 may for example include a coating method, an injecting method, an inkjet printing method, or a deposition method, and is not limited. Also, a photolithography process and a UV curing method can be optionally performed.

The polarizer layer PL1 is configured to enhance the contrast ratio of the display device DD1 and is disposed on the display panel DP1 to cover the display panel DP1. For example, the polarizer layer PL1 is used as an anti-reflection film for preventing ambient light from being reflected by the display device DD1. In this embodiment, the polarizer layer PL1 may include a linear polarizer LP1, a half wave film HW, and a quarter wave film QW, but not limited thereto. The quarter wave film QW, the half wave film HW and the linear polarizer LP1 can be stacked sequentially, and the half wave film HW and the quarter wave film QW are disposed between the display panel DP1 and the linear polarizer LP1. Specifically, the first surface S1 is an outer surface of the linear polarizer LP1, the second surface S2 is an outer surface of the quarter wave film QW, and the second surface S2 of the polarizer layer PL1 can be adhered to the display panel DP1. In this embodiment, the display device DD1 may further include an adhesive layer AL1 disposed between the polarizer layer PL1 and the display panel DP1 for attaching the second surface S2 of the polarizer layer PL1 to the display panel DP1. In another embodiment, the polarizer layer PL1 may be composed of the linear polarizer LP1, and has no half wave film HW and no quarter wave film QW, so the linear polarizer LP1 is directly attached to the display panel DP1 through the adhesive layer AL1.

In this embodiment, the polarizer layer PL1 has a first thickness T1 in a vertical direction Z, the cover layer CL1 has a second thickness T2 in the vertical direction Z, and the first thickness T1 is greater than the second thickness T2. The vertical direction Z can be a thickness direction, and perpendicular to the first surface S1 of the polarizer layer PL1. The polarizer layer PL1 can serve as a support substrate for supporting the cover layer CL1 during formation of the cover layer CL1. Specifically, a ratio of the second thickness T2 to the first thickness T1 can be in a range from 0.05 to 0.9. With such thickness ratio, when a combined body 10 including the polarizer layer PL1 and the cover layer CL1 is attached onto the display panel DP1 by the adhesive layer AL1, the cover layer CL1 is not easily damaged. Also, other yield problems during attaching may be prevented. For example, the second thickness T2 of the cover layer CL1 may be in a range from 10 micrometers to 100 micrometers or in a range from 20 micrometers to 80 micrometers, and the first thickness T1 of the polarizer layer PL1 may be in a range from 100 micrometers to 200 micrometers or in a range from 150 micrometers to 190 micrometers.

The display panel DP1 has a display surface DS and a back surface BS opposite to each other, and the display surface DS has a display region DR for displaying images. The cover layer CL1 and the polarizer layer PL1 cover the display region DR. For example, the display panel DP1 may be a flexible display panel or a foldable display panel, so the display device DD1 can be flexible or foldable, and the display device DD1 can provide portability when the display device DD1 is in a folded or bent state. The flexible display panel or the foldable display panel may be a self-luminous display panel, such as an organic light-emitting diode (OLED) display panel, an inorganic light-emitting diode (LED) display panel or a quantum dot light-emitting diode (QLED) display panel, but not limited herein. In this embodiment, the display panel DP1 may include a supporting structure 20, a display layer DL, and an encapsulation layer EL. The supporting structure 20 is configured to support layers or films disposed thereon. The supporting structure 20 can include a flexible substrate 20A and a supporting film 20B, and the flexible substrate 20A can be disposed on the supporting film 20B. The display layer DL is disposed on the supporting structure 20 for displaying images, for example the display layer DL may include driving circuits and display units. The driving circuits are for controlling the display of display units, and the display units are for displaying different color light. The driving circuits may for example include thin-film transistors, data lines, scan lines, power lines, and other required elements, but not limited herein. The display units may for example include inorganic light-emitting diodes, organic light-emitting diodes or quantum dot light-emitting diodes. For inorganic light-emitting diodes, each light-emitting diode (LED) may be a chip with inorganic light emitting material for emitting light, for example the chip size of a mini-LED is in a range from 100 µm to 300 µm, or the chip size of a micro-LED is in a range from 1 µm to 100 µm. Those skilled in the art will understand that the display layer DL may further include insulation layers for insulating different elements and other required elements, and will not be detailed herein.

The encapsulation layer EL is disposed on the display layer DL and configured to encapsulate the display layer DL on the supporting structure 20, so as to prevent the display layer DL from damage by oxygen and moisture or other damage during manufacturing processes or during use. The encapsulation layer EL may include a flexible encapsulation material, which includes an inorganic material, an organic material, or a combination thereof. For example, the inorganic material may be for example aluminum oxide, silicon nitride, silicon oxynitride, or diamond-like carbon, and the organic material may be UV-curable adhesive, polymethyl methacrylate, polyimide, parylene, polyacrylate or acrylate monomer. In this embodiment, the display panel DP1 may be a top emission display panel, but not limited thereto. In another embodiment, the display panel DP1 may be a double-emission display panel or a bottom-emission display panel.

The display panel DP1 has a third thickness T3 in the vertical direction Z. The third thickness T3 may be measured from an outer surface of the encapsulation layer EL (that is the display surface DS) to a bottom surface of the display panel DP1 (that is the back surface BS). The bottom surface of the display panel DP1 is the bottom surface of the supporting film 20B of the supporting substrate 20.

Figure 2:
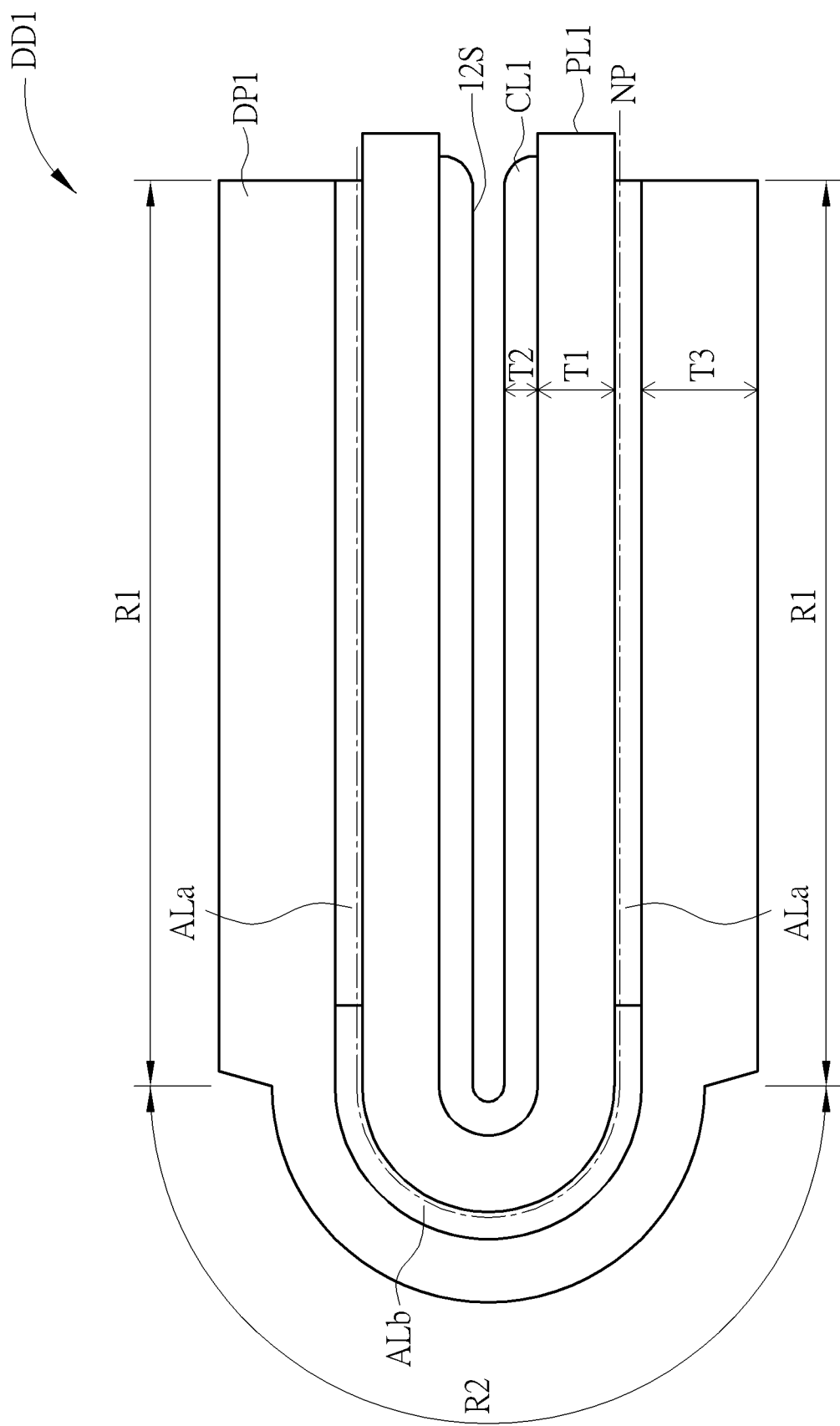
FIG. 2 schematically illustrates the display device in a folded state.

Specifically, refer to FIG. 2, which schematically illustrates the display device in a folded state. The display device is folded such that two portions of a cover surface 12S of the cover layer CL1 face each other, which can be referred to as folded inwardly. In other embodiments, although not shown, the display device can also be folded outwardly, such that two portions of the back surface BS of the display panel DP1 face each other. The term "folded" in the present disclosure means curved, bent, folded, rolled, stretched, flexed, or the like (generally referred to as "folded" or "foldable" hereinafter).

According to some embodiments, a ratio of the third thickness T3 to a sum of the first thickness T1 and the second thickness T2 can be in a range from 0.8 to 1.2. Through the thickness ratio design, the stress to the polarizer layer PL1 and the cover layer CL1 and the stress to the display panel DP1 may be balanced, and damages to the display device DD1 during folding or bending may be minimized. Thus, crack on the cover layer CL1, the layers (such as circuits) of the display panel DP1, or other layers in the display device DD1 can be prevented or mitigated. For example, the first thickness T1 may be 100 micrometers, the second thickness T2 may be 60 micrometers, and the third thickness T3 may be 150 micrometers, but not limited herein.

In some embodiments, an area of the polarizer layer PL1 can be equal to or greater than an area of the display panel DP1. For example, referring to FIG. 1, a first distance F1 between an edge 31 of the display panel DP1 and an edge 32 of the polarizer layer PL1 can be in a range from 0 to 5 millimeters. When the area of the of the polarizer layer PL1 is greater than the area of the display panel DP1, the first distance F1 can be greater than 0, for example, in a range from 0.1 to 5 millimeters.

In this embodiment, the display device DD1 may be for example formed by the following description. First, referring to FIG. 1, a flexible substrate 20A is formed on a rigid substrate (not shown), and followed by forming the display layer DL on the flexible substrate 20A. The rigid substrate may be for example a glass substrate. The encapsulation layer EL is then formed to cover and encapsulate the display layer DL. After the encapsulation layer EL is formed, the rigid substrate is removed to expose the flexible substrate 20A. Then, a supporting film 20B is adhered to the flexible substrate 20A through an adhesive (not shown). Accordingly, the display panel DP1 is formed. Also, the flexible substrate 20A and the supporting film 20B may constitute the supporting structure 20 for supporting the display layer DL and the encapsulation layer EL. The flexible substrate 20A and the supporting film 20B may be formed of any insulating material that is flexible. For example, the insulating material may include polyethylene terephthalate (PET), polyimide (PI), or polyethylene naphthalate (PEN), but not limited thereto.

Figure 3:
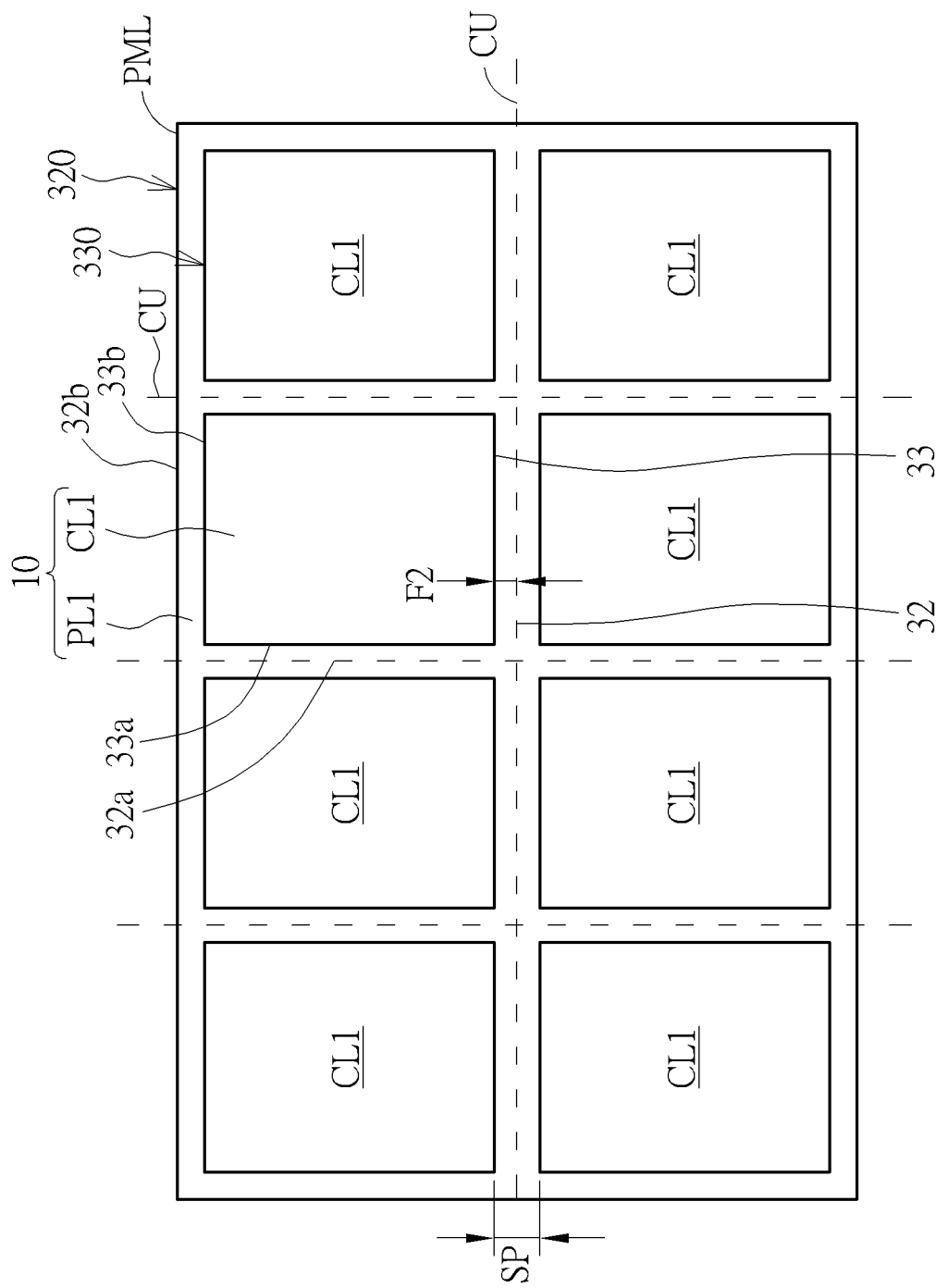
FIG. 3 schematically illustrates a method of forming the cover layer.

Refer to FIG. 3 as well as FIG. 1. FIG. 3 schematically illustrates a method of forming the cover layer CL1. First, a cover structure (not shown) is formed by coating on a polarizer mother layer PML. Then, the cover structure is patterned by photolithography to form a plurality of cover layers CL1. The cover layers CL1 may be formed and separated from each other, and two adjacent cover layers CL1 can be separated by a spacing SP. Thereafter, the polarizer mother layer PML is cut along cutting lines CU. Thus, a plurality of the combined bodies 10 are separated. Each individual combined body 10 includes one polarizer layer PL1 and one cover layer CL1. Then, the combined body 10 can be attached onto the display panel DP1 by the adhesive layer A1 to form the display device DD1 as shown in FIG. 1 and as mentioned above.

In some embodiments, due to the design of the spacing SP between the cover layers CL1, when the polarizer mother layer PML is cut, the cover layers CL1 will not be cut. Thus, no crack would be generated in the cover layer CL1, so an optical function of the cover layer CL1, such as transparency, would not be affected by the cutting process, or crack on the cover layer CL1 can be mitigated. In some embodiments, in order not to cut the cover layer CL1, the spacing SP may be greater than a width of the cutting line CU. For example, the spacing SP can be in a range from 0 to 40 micrometers, for example, in a range from 2 to 30 micrometers. The spacing SP can be greater than 0.

Referring to FIG. 1 and FIG. 3, after the polarizer mother layer PML is cut, and a plurality of the combined bodies 10 are formed. For one individual combined body 10, the edge of the cover layer CL1 is disposed inwardly than the edge of the polarizer layer PL1. Specifically, an edge 33 of the cover layer CL1 is spaced apart from and disposed inwardly than the edge 32 of the polarizer layer PL1 by a second distance F2, which may be called a buffer region. The distance F2 may be in a range from 0 to 20 micrometers, for example, in a range from 1 micrometer to 15 micrometers. Specifically, another edge 33a of the cover layer CL1 can be spaced apart from another edge 32a of the polarizer layer PL1. In some embodiments, each edge of each cover layer CL1 is spaced apart from a corresponding edge of the polarizer layer PL1 respectively, so the buffer regions can surround the cover layer CL1, but not limited thereto.

Alternatively, in other embodiments, first, a cover structure (not shown) is formed by coating on a polarizer mother layer PML. The cover structure can be not subjected to patterning, and the plurality of cover layers CL1 can be continuous and in an integral structure on the polarizer mother layer PML. That is, no spacing SP is present between two adjacent cover layers CL1. Then, the polarizer mother layer PML and the cover structure are cut along the cutting lines CU, and a plurality of combined bodies 10 are formed. Thus, in the individual combined body 10, at least two adjacent edges of the cover layer CL1 can be aligned to the corresponding two edges of the polarizer layer PL1. For example, referring to FIG. 3, in the combined body 10, the edges 33 and 33a of the cover layer CL1 can be aligned to the corresponding edges 32 and 32a of the polarizer layer PL1, respectively.

In some embodiments, the cover structure can be formed such that an edge 330 of the cover structure is spaced apart from the corresponding edge 320 of the polarizer mother PML, as shown in FIG. 3. Thus, at least one edge of the cover layer CL1 may be spaced apart from the corresponding edge of the polarizer PL1 (which is a part of the edge of the polarizer mother layer PML). For example, at least one edge of the cover layer CL1, such as the edge 33b, may be spaced apart from the corresponding edge of the polarizer layer PL1, such as the edge 32b, and at least two adjacent edges of the cover layer CL1, such as the edge 33 and the edge 33a, may be respectively aligned to at least two adjacent edges of the polarizer layer PL1, such as the edge 32 and the edge 32a. Or, alternatively, in other embodiments, the cover structure can be formed such that an edge 330 of the cover structure is aligned to the corresponding edge 320 of the polarizer mother PML, not shown.

According to some embodiments, the display panel can further include a touch layer to provide the touch function, thus forming a touch display panel. For example, referring to FIG. 1, the display panel DP1 of this embodiment may selectively further include a touch layer TL between the encapsulation layer EL and the adhesive layer AL1 for touch sensing. FIG. 1 shows that the touch layer TL is directly formed on the encapsulation layer EL, and the touch display panel is so-called on-cell type display panel. Since a thickness of the touch layer TL is much less than the third thickness T3 of the display panel DP1, the disposition of the touch layer TL may not affect the folding or bending of the display device DD1. Accordingly, the third thickness T3 is still defined from an outer surface of the encapsulation layer EL (that is the display surface DS) to a bottom surface of the display panel DP1 (that is the back surface BS) when the display panel DP1 includes the touch layer TL. In another embodiment (not shown), the touch layer TL may be disposed between the encapsulation layer EL and the supporting substrate 20, so the display panel DP1 is so-called in-cell type display panel. In further another embodiment (not shown), the touch layer TL may be formed on a film and followed by being adhered to the encapsulation layer EL through another adhesive, so the display panel DP1 is so-called out-cell type display device.

According to some embodiments, the display device can be foldable. FIG. 1 shows the display device DD1 in an un-folded state, and FIG. 2 shows the display device DD1 in a folded state. The display device DD1 may have a main region R1 and a foldable region R2. In other words, the flexibility of the display device DD1 in the foldable region R2 is greater than the flexibility of the display device DD1 in the main region R1, so the display device DD1 in the foldable region R2 may serve as a foldable portion that is capable of being folded. Specifically, the display device DD1 may further have another main region R1, and the foldable region R2 is disposed between the two main regions R1. According to some embodiments, the cover layer in the foldable region R2 may include recess portions. For example, the cover layer CL2 has a plurality of first recess portions 51 in the foldable region R2 as shown in following FIG. 4 and FIG. 5, which can increase flexibility of the foldable region R2, but not limited thereto. In another embodiment, as shown in FIG. 1, the cover layer CL1 in the foldable region R2 may not have the first recess portions.

According to some embodiments, referring to FIG. 1, the adhesive layer AL1 of this embodiment may selectively include two first adhesive parts ALa and a second adhesive part ALb, in which the first adhesive parts ALa are disposed in the main regions R1, and the second adhesive part ALb is disposed in the foldable region R2. In order to enhance foldability in the foldable region R2 and differentiate the flexibility in the main regions R1 from the flexibility in the foldable region R2, a Young's modulus of the second adhesive part ALb can be less than a Young's modulus of each first adhesive part ALa. Accordingly, the second adhesive part ALb is more elastic than each first adhesive part ALa. The Young's modulus described herein is defined as the Young's modulus of the adhesive layer AL1 after being cured. In another embodiment, the adhesive layer AL1 may be composed of one layer that has uniform Young's modulus.

In addition, in some embodiments, the supporting substrate 20 can include a second recess portion 52 in the foldable region R2, as shown in FIG. 1. The second recess portion 52 can be on a surface away from the display layer DL, for example, on the back surface BS of the display panel DP1. Although not shown, the second recess portion 52 can be more than one, for example, plural, according to requirements. Due to the second recess portion 52, the stress to the display panel DP1 in the foldable region R2 can be mitigated. In some embodiments, the second recess portion 52 may penetrate through the supporting film 20B and expose the surface of the flexible substrate 20A, as shown in FIG. 1. Alternatively, in some embodiments, although not shown in figures, the second recess portion 52 may not penetrate through the supporting film 20B, and a portion of the supporting film 20B remains in the position corresponding to the second recess portion 52. In some embodiments, the supporting substrate 20 may not have the second recess portion 52.

The display device of the present disclosure is not limited to the above embodiment. Further embodiments of the present disclosure are described below. To compare the embodiments conveniently and simplify the description, the same component would be labeled with the same symbol in the following. The following description will detail the dissimilarities among different embodiments and the identical features will not be redundantly described.

Figure 4:
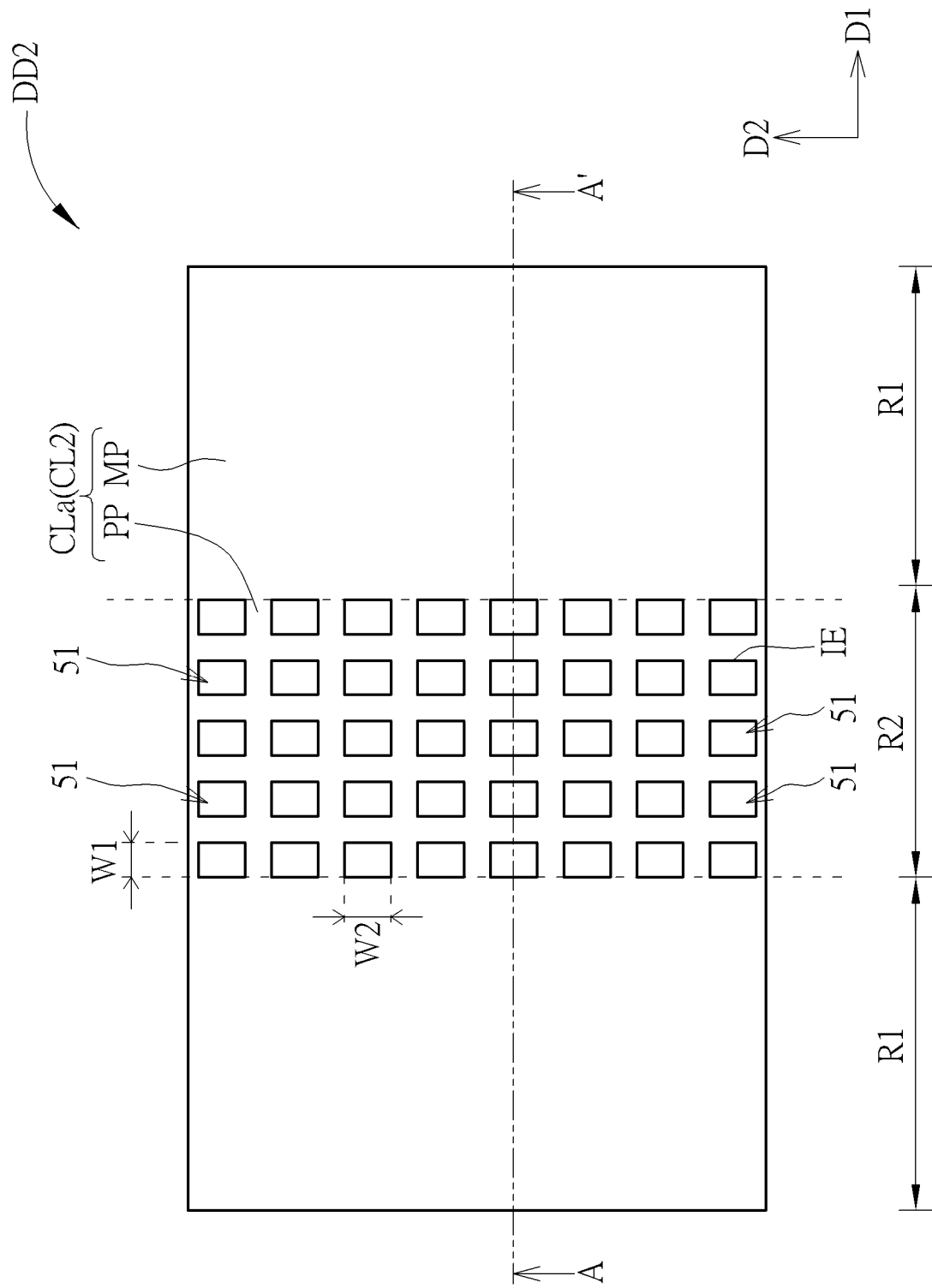
FIG. 4 schematically illustrates a top view of a display device according to a second embodiment of the present disclosure.
Figure 5:
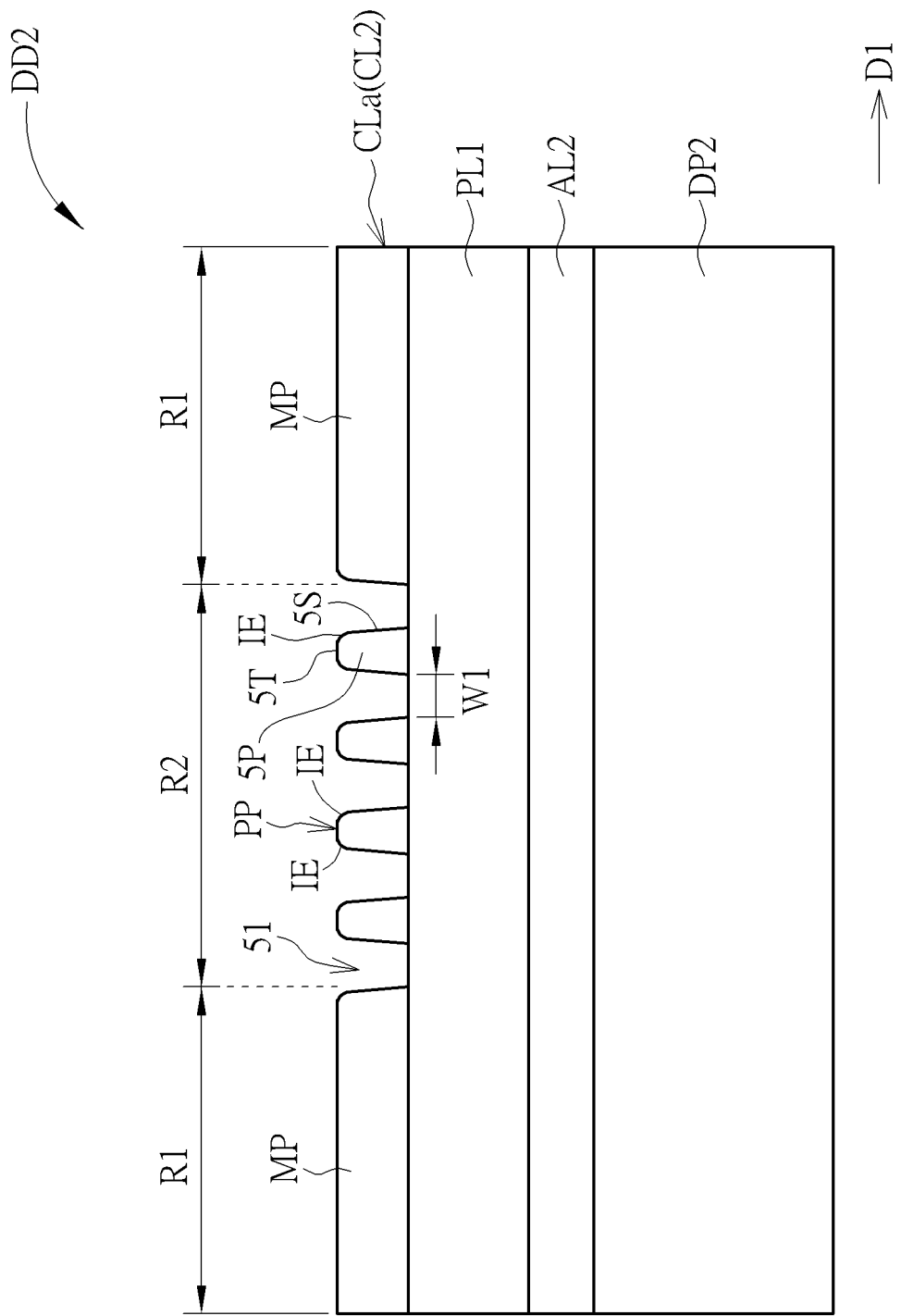
FIG. 5 schematically illustrates a cross-sectional view of the display device taken along a cross-sectional line A-A' of FIG. 4.

FIG. 4 schematically illustrates a top view of a display device according to a second embodiment of the present disclosure, and FIG. 5 schematically illustrates a cross-sectional view of the display device taken along a cross-sectional line A-A' of FIG. 4. A main difference between the display device DD2 of this embodiment and the display device DD1 of the first embodiment as shown in FIG. 1 is the design of the cover layer. In FIG. 4 and FIG. 5, the cover layer CL2 includes a first sub-layer CLa, and the first sub-layer CLa includes a plurality of first recess portions 51 in the foldable region R2. Each first recess portion 51 may be a through hole penetrating through the first sub-layer CLa and expose the surface of the polarizer layer PL1, as shown in FIG. 5. Or, alternatively, in some embodiments, the first recess portions 51 may not penetrate through the first sub-layer CLa, and a portion of the first sub-layer CLa remains in the position corresponding to the first recess portions 51. Specifically, the first sub-layer CLa includes two main parts MP in the main regions R1 and a patterned part PP in the foldable region R2. The two main parts MP can be connected by the patterned parts PP to form an integral portion, and the patterned part PP can surround the first recess portions 51. Through the first recess portions 51, the flexibility of the display device DD2 in the foldable region R2 can be greater than the flexibility of the display device DD2 in the main regions R1. In this embodiment, the first sub-layer CLa has two main parts MP disposed in the main regions R1 respectively, but not limited thereto. In another embodiment, at least one of the main parts MP of the first sub-layer CLa may have first recess portions 51.

For easy illustration, FIG. 4 and FIG. 5 shows that the edges of display panel DP2, the polarizer layer PL1, and the cover layer CL2 are aligned. However, in some embodiments, the edges of display panel DP2, the polarizer layer PL1, and the cover layer CL2 can be not aligned, as shown in FIG. 1. That is, in the display device DD2, the edge of the display panel DP2 and the edge of the polarizer layer PL1 can be spaced apart by a first distance F1, and the edge of the polarizer layer PL1 and the edge of the cover layer CL2 can be spaced apart by a second distance F2, as mentioned in the previous embodiments. Similarly, in the following embodiments, the edges of display panel, the polarizer layer, and the over layer can be aligned as shown in the following figures for easy illustration. Alternatively, the edges of display panel, the polarizer layer, and the cover layer can be not aligned, and the display devices in the following embodiments can have the design of the first distance F1 and the second distance F2, as mentioned above. Also, in the procedure of cutting the polarizer mother layer, the buffer region design for the cover layer as mentioned above can be performed in the following embodiments.

In some embodiments, the arrangement of the first recess portions 51 may be for example a matrix arrangement, a brick arrangement or other suitable arrangement. The shape of one of the first recess portions 51 may be for example rectangular, hexagonal or other suitable shapes. Also, referring to FIG. 4, a width W1 of each first recess portion 51 in a first direction D1 may be equal to or less than 20 micrometers, and a width W2 of each first recess portion 51 in a second direction D2 may also be equal to or less than 20 micrometers. Since the widths W1 and W2 are equal to or less than 20 micrometers, the first recess portions 51 would not be easily seen during use, thereby mitigating visibility of the first recess portions 51 and maintaining image quality.

Furthermore, in some embodiments, the profile of the patterned part PP of the first sub-layer CLa in the foldable region R2 can have a curved shape. Specifically, referring to FIG. 5, the patterned part PP includes a plurality of projections 5P. Two adjacent projections 5P are separated by one of the first recess portions 51. A top surface 5T of the projection 5P connects to a sidewall 5S of the first recess portion 51 by a corner IE, and the profile of the corner IE has a curved shape, for example, a rounded shape. Since the first sub-layer CLa is the outmost layer of the display device DD2, through the curved corner design, the first sub-layer CLa can be prevented from damage resulted from scratching or hitting during use. In another embodiment, the corners IE of the patterned part PP abutting the first recess portions 51 may have right-angled corners. In some embodiments, the top surface 5T of the projection 5P can have a curved shape.

Referring to FIG. 5, the adhesive layer AL2 of this embodiment may be composed of one layer that has single Young's modulus. In another embodiment, the adhesive layer AL2 may be the same as the adhesive layer AL1 of the first embodiment. That is, the adhesive layer AL2 can have a first adhesive layer in the main region R1 and a second adhesive layer in the foldable region R2, and the first adhesive layer and the second adhesive layer can have different Young's moduli. FIG. 5 shows that the display panel DP2 does not include the second recess portion. However, alternatively, in some embodiments, the display panel DP2 can include the second recess portion, similar to the second recess portion 52 disposed in the supporting film 20B as shown in FIG. 1, and detailed description is omitted here for brevity.

Figure 6:
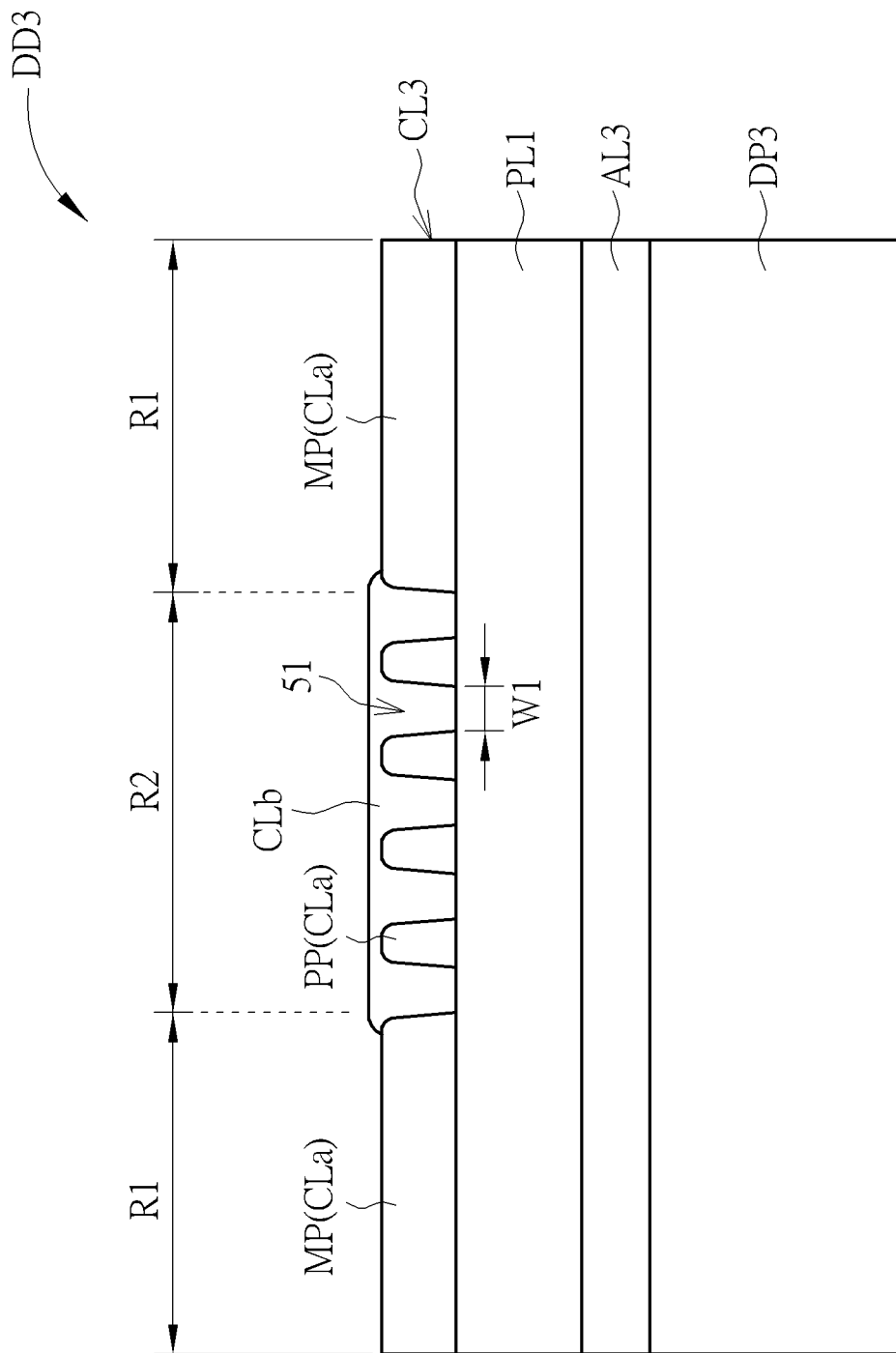
FIG. 6 schematically illustrates a display device according to a third embodiment of the present disclosure.

FIG. 6 schematically illustrates a display device according to a third embodiment of the present disclosure. A difference between the display device DD3 of this embodiment and the display device DD2 of the second embodiment shown in FIG. 4 is the design of the cover layer. In FIG. 6, the cover layer CL3 of this embodiment further includes a second sub-layer CLb disposed in the foldable region R2, and the first sub-layer CLa and the second sub-layer CLb have different Young's moduli. In this embodiment, a Young's modulus of the second sub-layer CLb is less than a Young's modulus of the first sub-layer CLa, so that the second sub-layer CLb can be more elastic than the first sub-layer CLa, and the display device DD3 in the foldable region R2 may provide larger flexibility than the display device DD3 in each main region R1. At least a portion of the second sub-layer CLb is filled in the first recess portions 51 of the first sub-layer CLa. In this embodiment, the second sub-layer CLb may cover the patterned part PP of the first sub-layer CLa. A part of the second sub-layer CLb may further extend into the main regions R1, but not limited thereto. Furthermore, a ratio of the Young's modulus of the first sub-layer CLa to the Young's modulus of the second sub-layer CLb is in a range from 2 to 20, so as to balance the stress between the first sub-layer CLa and the second sub-layer CLb. In this embodiment, the adhesive layer AL3 and the display panel DP3 may be the same as or similar to the above-mentioned adhesive layers and the display panels, and detailed descriptions are omitted.

Figure 7:
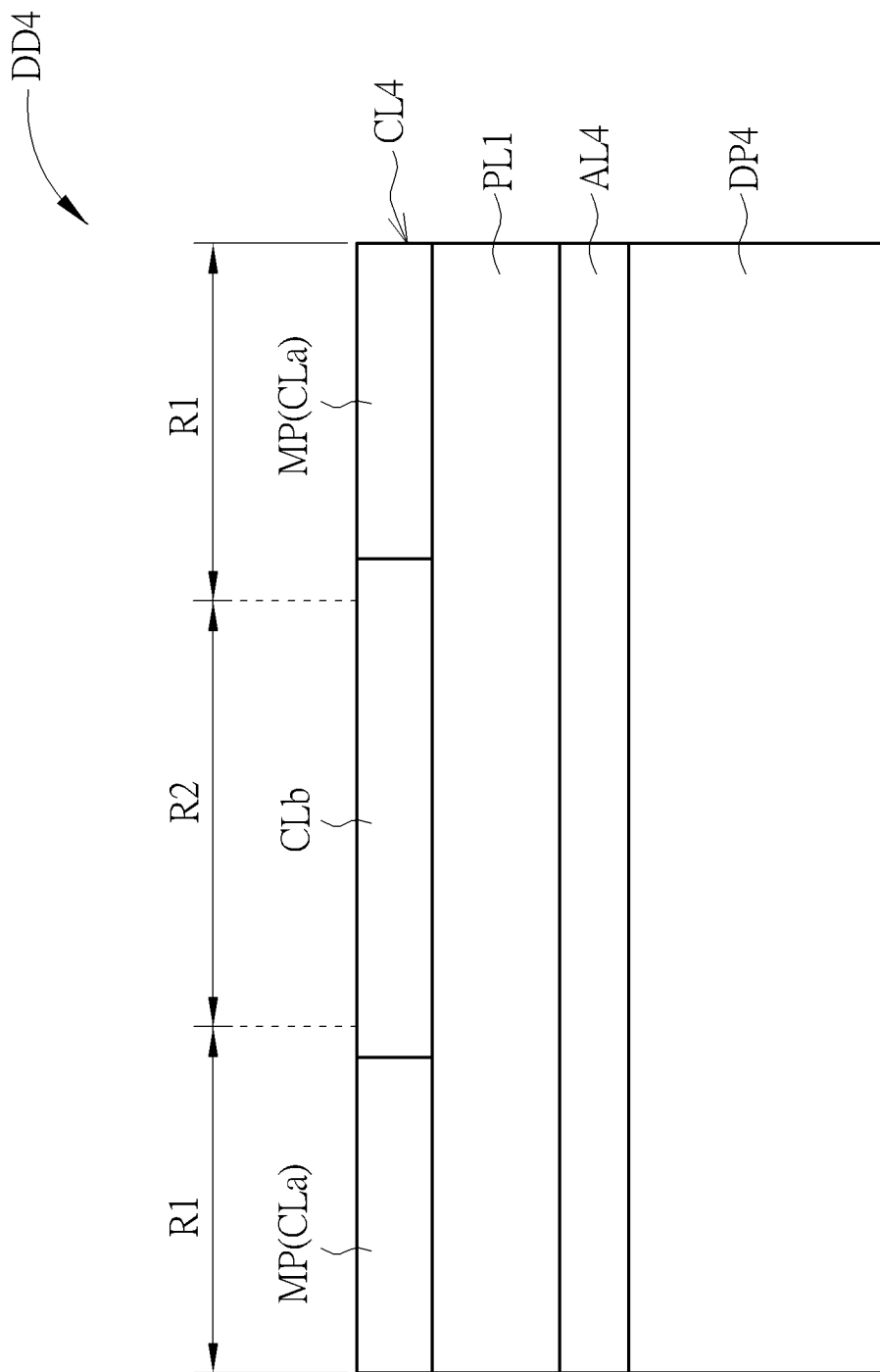
FIG. 7 schematically illustrates a display device according to a fourth embodiment of the present disclosure.

FIG. 7 schematically illustrates a display device according to a fourth embodiment of the present disclosure. A difference between the display device DD4 of this embodiment and the display device DD3 of the third embodiment shown in FIG. 6 is the design of the cover layer. In FIG. 7, the first sub-layer CLa is only disposed in the main regions R1, and the second sub-layer CLb is disposed in the foldable region R2 and covers the foldable region R2. In this embodiment, the first sub-layer CLa only has the main parts MP in the main regions R1 respectively, but not limited thereto. In some embodiments, the first sub-layer CLa and the second sub-layer CLb can have different Young's moduli. FIG. 7 shows that the first sub-layer CLa in the main region R1 has no recess portion, and the second sub-layer CLb in the foldable region R2 has no recess portion. However, in another embodiment, at least one of the main parts MP of the first sub-layer CLa in the main regions R1 may have patterned structure. In this embodiment, the adhesive layer AL4 and the display panel DP4 may be the same as or similar to the above-mentioned adhesive layers and the display panels, and detailed descriptions are omitted.

Figure 8:
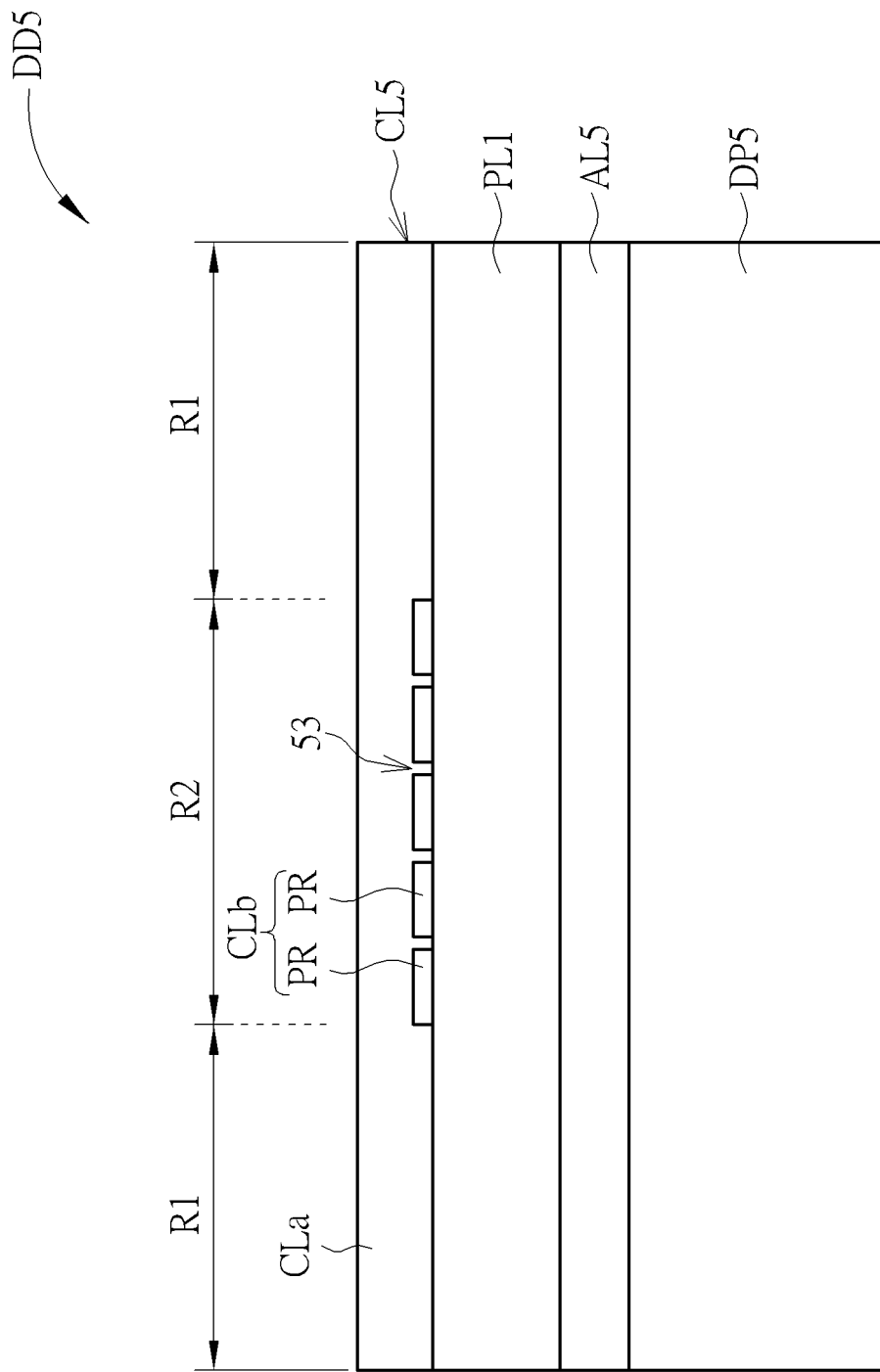
FIG. 8 schematically illustrates a display device according to a fifth embodiment of the present disclosure.

FIG. 8 schematically illustrates a display device according to a fifth embodiment of the present disclosure. A difference between the display device DD5 of this embodiment and the display device DD4 of the fourth embodiment shown in FIG. 7 is the design of the cover layer. In FIG. 8, the second sub-layer CLb includes a plurality of third recess portions 53. Specifically, the second sub-layer CLb includes a plurality of protrusions PR separated from each other, and the third recess portion 53 is disposed between any two of the adjacent protrusions PR. Each third recess portion 53 may be a through hole penetrating through the second sub-layer CLb and expose the surface of the polarizer layer PL1, as shown in FIG. 8. Or, alternatively, in some embodiments, the third recess portions 53 may not penetrate through the second sub-layer CLb, and portions of the second sub-layer CLb can remain in the position corresponding to the third recess portions 53. For example, a width of each third recess portion 53 may be equal to or less than 20 micrometers. In this embodiment, the first sub-layer CLa further extends into the foldable region R2, and at least a portion of the first sub-layer CLa is filled in the third recess portions 53. The first sub-layer CLa may further cover the second sub-layer CLb. The present disclosure is not limited thereto. In another embodiment, the first sub-layer CLa may not extend into the foldable region R2. In this embodiment, the adhesive layer AL5 and the display panel DP5 may be the same as or similar to the above-mentioned adhesive layers and the display panels, and detailed descriptions are omitted.

Figure 9:
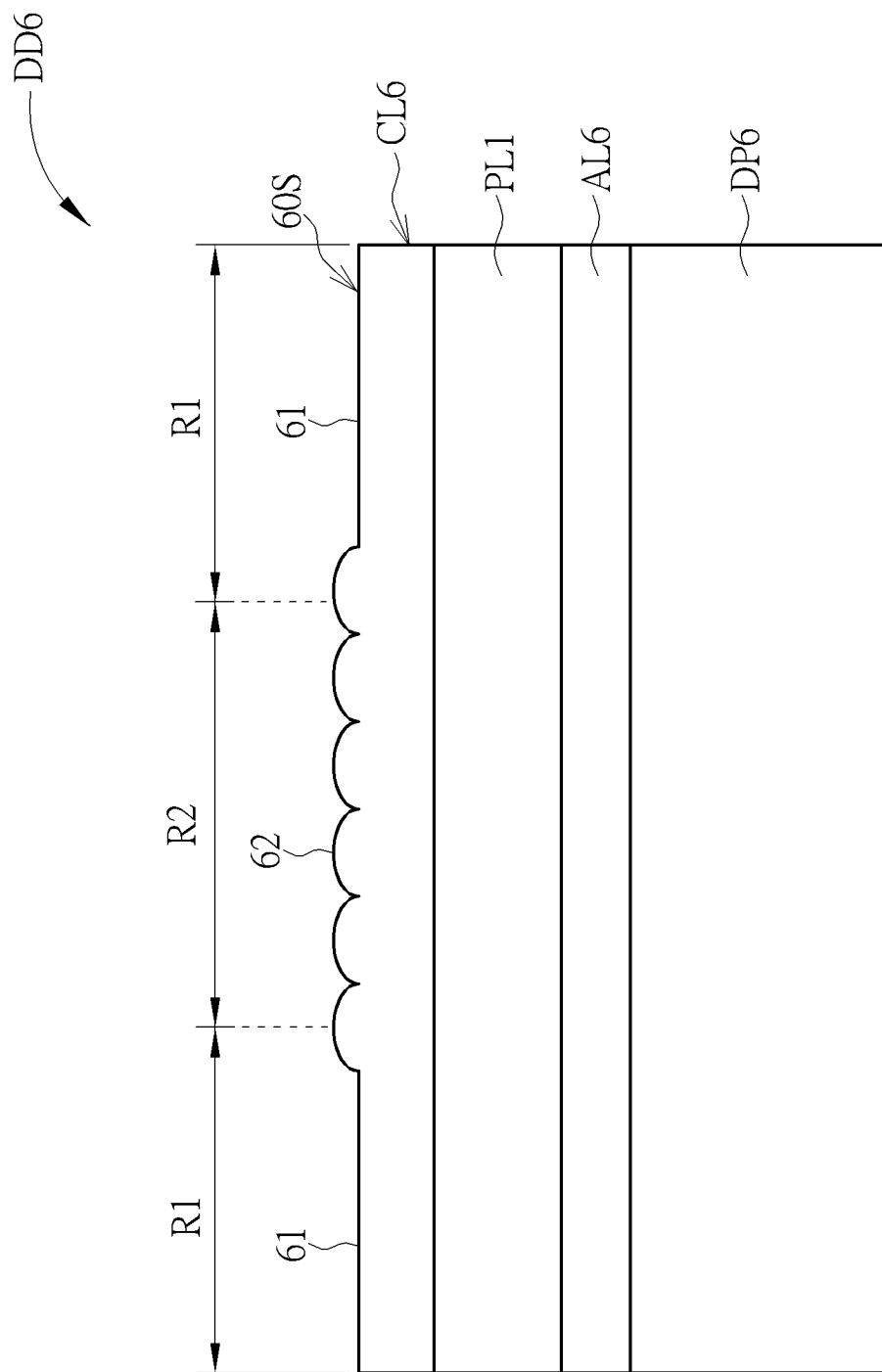
FIG. 9 schematically illustrates a display device according to a sixth embodiment of the present disclosure.

FIG. 9 schematically illustrates a display device according to a sixth embodiment of the present disclosure. A main difference between the display device DD6 of this embodiment and the display device DD1 of the first embodiment shown in FIG. 1 is the surface roughness of the cover layer. In FIG. 9, the cover layer CL6 of this embodiment has a cover surface 60S away from the polarizer layer PL1, the cover surface 60S has two first parts 61 respectively in the main regions R1, and a second part 62 in the foldable region R2. A roughness of the second part 62 of the cover surface 60S in the foldable region R2 can be greater than a roughness of the first part 61 of the cover surface 60S in the main region R1. The difference between the roughness of the first part 61 and the roughness of the second part 62 may be achieved for example by an etching process, but not limited thereto. Through the roughness difference, elasticity of the display device DD6 in the foldable region R2 can be greater than that in the main regions R1. In this embodiment, the cover layer CL6 may be formed of the same material, but not limited thereto. In another embodiment, the cover layer CL6 may include a first sub-layer and a second sub-layer, the first sub-layer can include the first parts 61, and the second sub-layer can include the second part 62. In this embodiment, the adhesive layer AL6 and the display panel DP6 may be the same as or similar to the above-mentioned adhesive layers and the display panels, and detailed descriptions are omitted.

Figure 10:
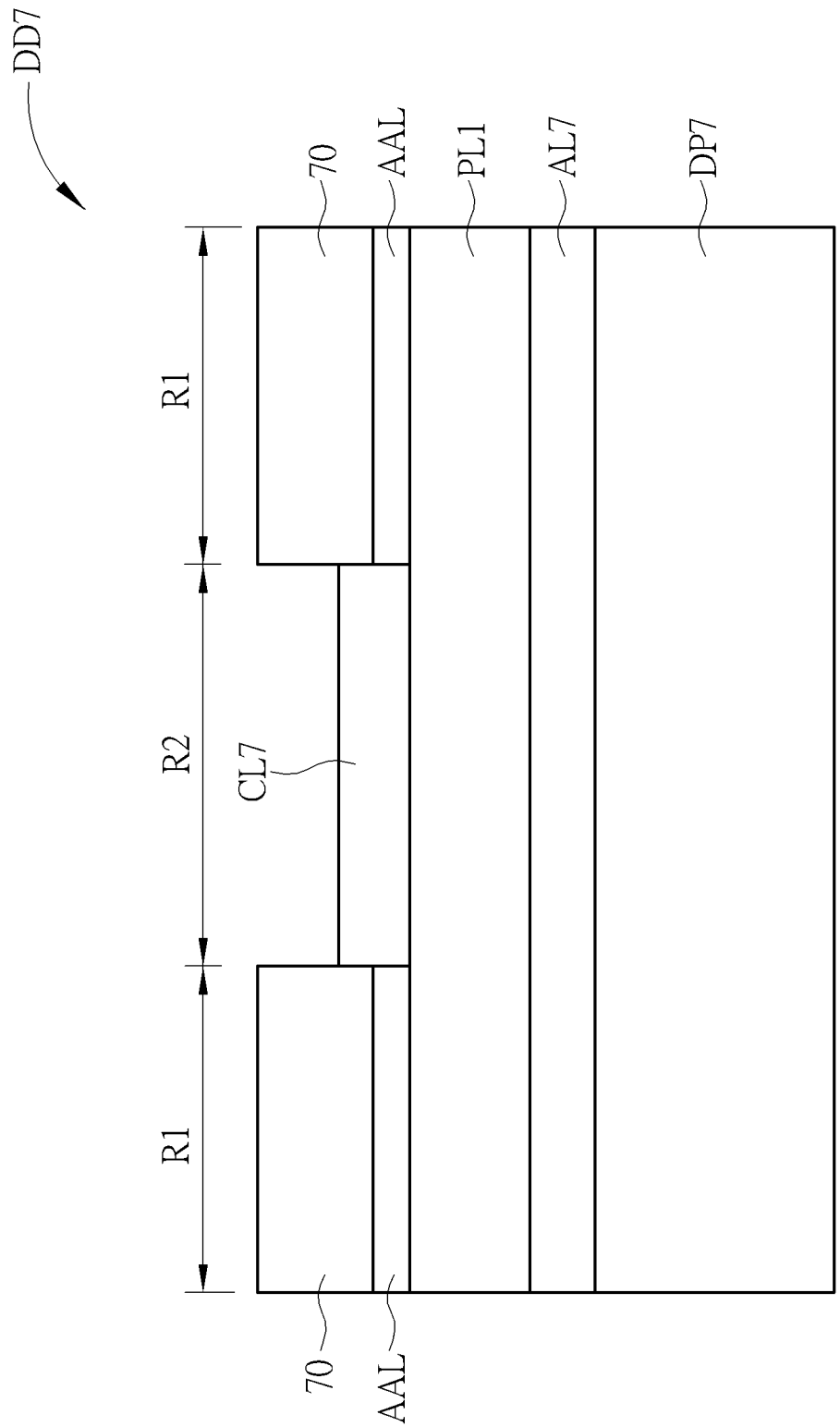
FIG. 10 schematically illustrates a display device according to a seventh embodiment of the present disclosure.

FIG. 10 schematically illustrates a display device according to a seventh embodiment of the present disclosure. A main difference between the display device DD7 of this embodiment and the display device DD1 of the first embodiment shown in FIG. 1 is that the cover layer CL7 is disposed in the foldable region R2, and the display device DD7 further includes a cover plate 70 and another adhesive layer AAL between the cover plate 70 and the polarizer layer PL1. Specifically, the display device DD7 includes two cover plates 70 and two adhesive layers AAL, in which each adhesive layer AAL attach each cover plate 70 to the polarizer layer PL1. Also, each cover plate 70 and each adhesive layer AAL are disposed in each main region R1 respectively. A Young's modulus of the cover plate 70 can be greater than a Young's modulus of the cover layer CL7. For example, each cover plate 70 may be formed of a rigid substrate, such as a glass substrate. In this embodiment, the adhesive layer AL7 and the display panel DP7 may be the same as or similar to the above-mentioned adhesive layers and the display panels, and detailed descriptions are omitted.

Figure 11:
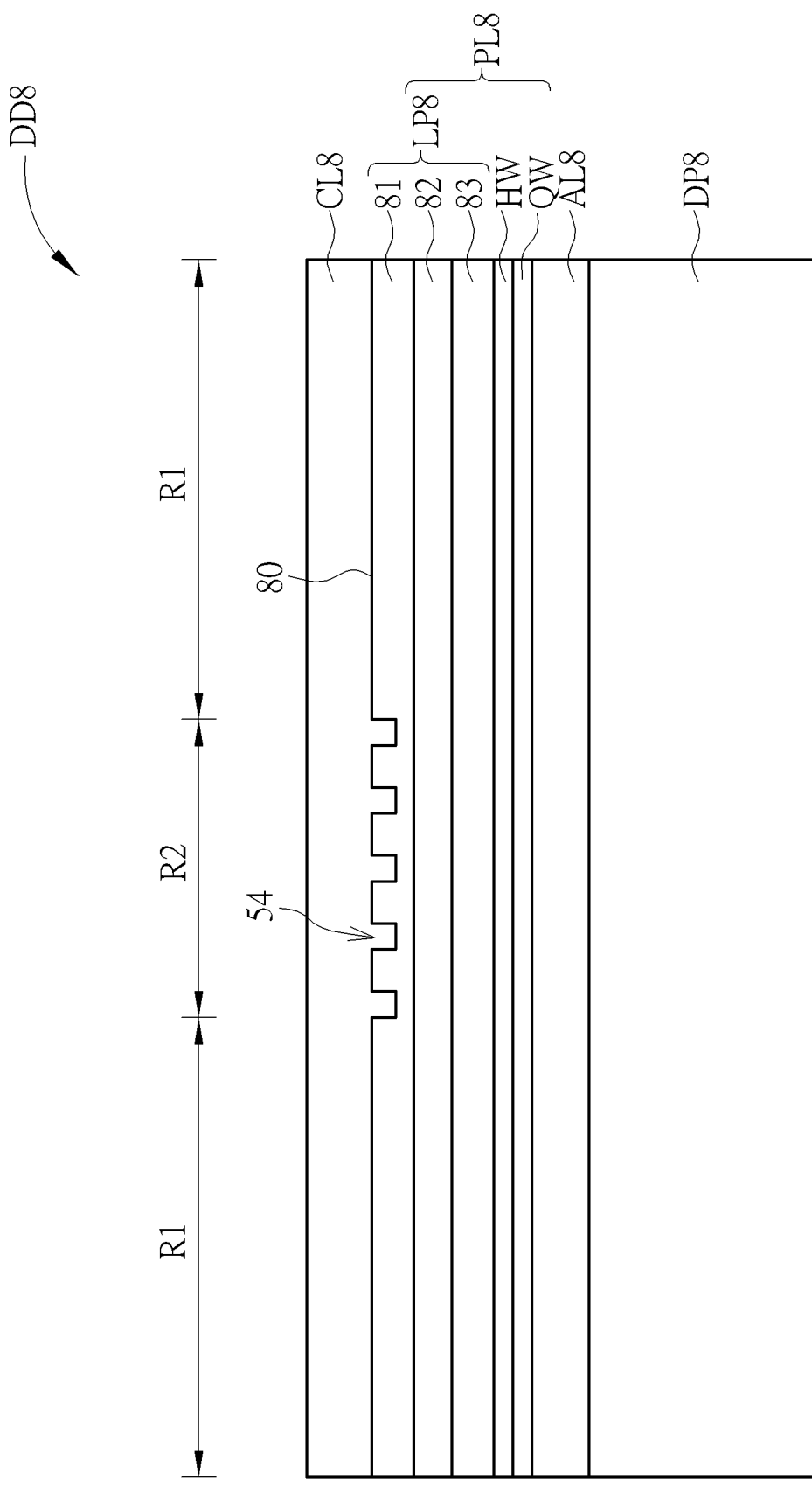
FIG. 11 schematically illustrates a display device according to an eighth embodiment of the present disclosure.

FIG. 11 schematically illustrates a display device according to an eighth embodiment of the present disclosure. A difference between the display device DD8 of this embodiment and the display device DD1 of the first embodiment shown in FIG. 1 is design of the polarizer. In FIG. 11, the polarizer layer PL8 includes a fourth recess portion 54. Specifically, the polarizer layer PL8 can include a linear polarizer LP8, and the linear polarizer LP8 can include a first protection layer 81, a second protection layer 83, and a linear polarizer material 82 disposed between the first protection layer 81 and the second protection layer 83. In some embodiments, the polarizer layer PL8 may include a half-wave film HW and a quarter-wave film QW, disposed under the linear polarizer LP8. Referring to FIG. 11, the first protection layer 81 can include the plurality of fourth recess portions 54 in the foldable region R2. Also, the fourth recess portions 54 is disposed on the first surface 80 of the polarizer layer PL8, which contacts the cover layer CL8, and a portion of the cover layer CL8 is filled in the fourth recess portions 54. Through the fourth recess portions 54, elasticity of the display device DD8 in the foldable region R2 can be greater than elasticity of the display device DD8 in the main regions R1. In some embodiments, each fourth recess portion 54 may be a through hole penetrating through the first protection layer 81 and expose the surface of the linear polarizer material 82, not shown in figures. Or, alternatively, in some embodiments, as shown in FIG. 8, the fourth recess portions 54 may not penetrate through the first protection layer 81, and a portion of the first protection layer 81 remains in the position corresponding to the fourth recess portions 54. In this embodiment, the adhesive layer AL8 and the display panel DP8 may be the same as or similar to the above-mentioned adhesive layers and the display panels, and detailed descriptions are omitted. Each of the first protection layer 81 and the second protection layer 83 can be, for example, a triacetyl cellulose (TAC) film, and the linear polarizer material 82 can be, for example, made of polyvinyl alcohol (PVA).

Figure 12:
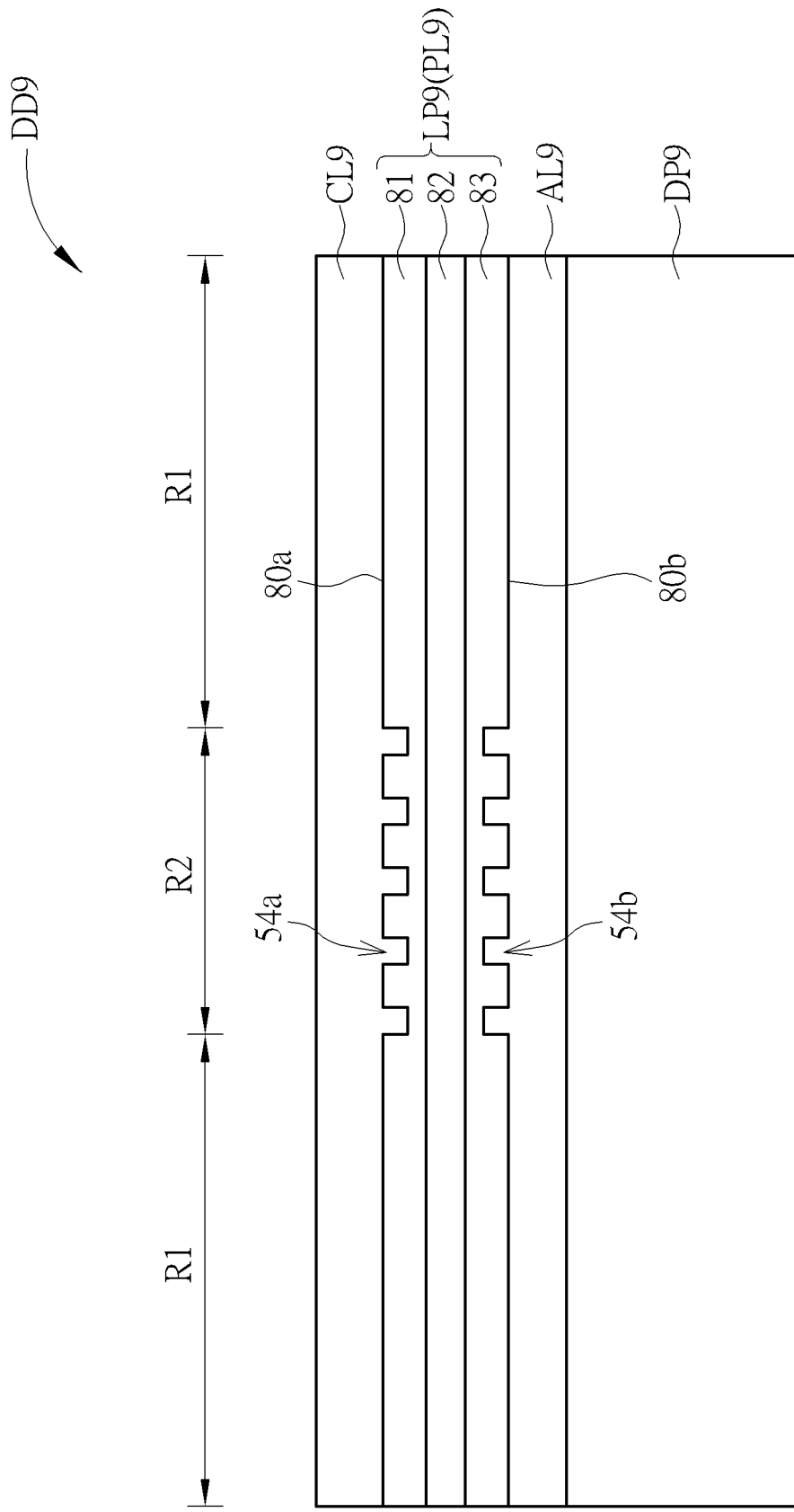
FIG. 12 schematically illustrates a display device according to a ninth embodiment of the present disclosure.

FIG. 12 schematically illustrates a display device according to a ninth embodiment of the present disclosure. A difference between the display device DD9 of this embodiment and the display device DD8 of the eighth embodiment shown in FIG. 11 is that the polarizer layer PL9 includes recess portions on two surfaces in the foldable region R2. Referring to FIG. 12, the polarizer layer PL9 includes a plurality of fourth recess portions 54a on the first surface 80a and a plurality of fifth recess portions 54b on the second surface 80b. Specifically, the fourth recess portions 54a are disposed on the first surface 80a of the first protection layer 81 in the foldable region R2, and the fifth recess portions 54b are disposed on the second surface 80b of the second protection layer 83 in the foldable region R2. In some embodiments, the fourth recess portions 54a can be filled with the cover layer CL9. Specifically, the polarizer layer PL9 of this embodiment may not include the half-wave film HW and the quarter-wave film QW, so the second protection layer 83 may contact the adhesive layer AL9, and the fifth recess portions 54b can be filled with the adhesive layer AL9. Through the fourth recess portions 54a and the fifth recess portions 54b, elasticity of the display device DD9 in the foldable region R2 can be much greater than elasticity of the display device DD9 in the main regions R1. In this embodiment, the adhesive layer AL9 and the display panel DP9 may be the same as or similar to the above-mentioned adhesive layers and the display panels, and detailed descriptions are omitted.

As the mentioned above, according to some embodiments, in the display device of the present disclosure, since the cover layer is directly formed on the polarizer layer, no extra layer exists between the cover layer and the polarizer layer, thereby reducing the number of the layers in the display device. Accordingly, in some embodiments, the stress between the cover layer and the polarizer layer can be simplified and mitigated. In some embodiments, by means of the design of the cover layer, recess portions, Young's modulus adjustment, and/or surface roughness of the cover layer, the display device can be suitable for use as a foldable display device, and crack occurring during folding can be prevented or mitigated.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device comprising:
   a display panel;
   a polarizer layer disposed on the display panel; and
   a cover layer disposed on the polarizer layer;
   wherein an area of the polarizer layer is greater than an area of the display panel, and a first distance between an edge of the display panel and an edge of the polarizer layer is in a range from 0 to 5 millimeters.

2. The display device as claimed in claim 1, wherein the display device has a main region and a foldable region.

3. The display device as claimed in claim 2, wherein the cover layer comprises a first sub-layer and a second sub-layer, a Young's modulus of the second sub-layer is less than a Young's modulus of the first sub-layer, and the second sub-layer is disposed in the foldable region.

4. The display device as claimed in claim 3, wherein one of the first sub-layer and the second sub-layer includes protrusions separated by recess portions.

5. The display device as claimed in claim 4, wherein another one of the first sub-layer and the second sub-layer fills the recess portions.

6. The display device as claimed in claim 4, wherein the recess portions are disposed in the foldable region.

7. The display device as claimed in claim 4, wherein a width of one of the recess portions is in a range from 0 to 40 micrometers.

8. The display device as claimed in claim 2, wherein the polarizer layer includes recess portions in the foldable region, and a portion of the cover layer is filled in the recess portions.

9. The display device as claimed in claim 2, wherein the display device further comprises a cover plate disposed in the main region, the cover plate is adhered to the polarizer layer with an adhesive layer, and a Young's modulus of the cover plate is greater than a Young's modulus of the cover layer.

10. The display device as claimed in claim 3, wherein a ratio of the Young's modulus of the first sub-layer to the Young's modulus of the second sub-layer is in a range from 2 to 20.

11. The display device as claimed in claim 2, wherein the display device further comprises an adhesive layer disposed between the display panel and the polarizer layer, the adhesive layer comprises a first adhesive part in the main region and a second adhesive part in the foldable region, and a Young's modulus of the second adhesive part is less than a Young's modulus of the first adhesive part.

12. The display device as claimed in claim 1, wherein the polarizer layer has a first thickness, the cover layer has a second thickness, and the second thickness is less than the first thickness.

13. The display device as claimed in claim 12, wherein a ratio of the second thickness to the first thickness is in a range from 0.05 to 0.9.

14. The display device as claimed in claim 13, wherein the display panel has a third thickness, and a ratio of the third thickness to a sum of the first thickness and the second thickness is in a range from 0.8 to 1.2.

15. The display device as claimed in claim 1, wherein the first distance between the edge of the display panel and the edge of the polarizer layer is in a range from 0.1 to 5 millimeters.

16. The display device as claimed in claim 1, wherein the cover layer has a pencil hardness greater than or equal to 6H.

17. The display device as claimed in claim 2, wherein the cover layer includes a main part in the main region and a patterned part in the foldable region.

18. The display device as claimed in claim 17, wherein the patterned part includes a plurality of projections, and a profile of one of corners of the patterned part has a curved shape.

19. The display device as claimed in claim 2, wherein the cover layer has a cover surface away from the polarizer layer, the cover surface has a first part in the main region and a second part in the foldable region, and a roughness of the second part is greater than a roughness of the first part.

20. The display device as claimed in claim 1, wherein the cover layer is a polymer.

* * * * *